(12) United States Patent
Miller et al.

(10) Patent No.: US 7,203,109 B1
(45) Date of Patent: Apr. 10, 2007

(54) DEVICE AND METHOD FOR DETECTING CORRUPTION OF DIGITAL HARDWARE CONFIGURATION

(75) Inventors: Jon S. Miller, Cooper City, FL (US); Edward A. Diaz, Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/314,269

(22) Filed: Dec. 21, 2005

(51) Int. Cl.
*G11C 7/00* (2006.01)

(52) U.S. Cl. .................. 365/201; 365/189.12; 365/240

(58) Field of Classification Search ................ 365/227, 365/189.02, 189.08, 189.12, 230.02, 201, 365/240; 714/33–46
See application file for complete search history.

(56) References Cited

U.S. PATENT DOCUMENTS 5,523,972 A * 6/1996 Rashid et al. .......... 365/185.22
6,301,344 B1 * 10/2001 Meyer et al. ................ 379/145
6,874,105 B2 3/2005 Buechner et al.
7,167,399 B2 * 1/2007 Wooldridge ........... 365/185.29

* cited by examiner

*Primary Examiner*—Son Dinh
*Assistant Examiner*—Hien N Nguyen

(57) ABSTRACT

A device for verifying hardware in a circuit arrangement that includes one or more configuration elements (106) operable to configure hardware elements (108) that are electrically coupled by one or more electrically-conductive pathways (110). The device includes a hardware-verification register (202) coupled to at least one of the electrically-conductive pathways (110). The register (202) is operable to sample a voltage level on at least one of the electrically-conductive pathways (110) at a first time point; store in a memory one or more bits, each bit representing the voltage level on at least one of the electrically-conductive pathways (110) at the first time point; sample a voltage level on at least one of the electrically-conductive pathways (110) at a second time point; and compare, for at least one of the electrically-conductive pathways, the voltage level at the first time point and the voltage level at the second time point.

16 Claims, 6 Drawing Sheets

DEVICE AND METHOD FOR DETECTING CORRUPTION OF DIGITAL HARDWARE CONFIGURATION

FIELD OF THE INVENTION

The present invention generally relates to the field of digital hardware corruption detection and more particularly to utilizing a configuration-corruption-detection circuit to transparently examine configuration bits within a digital integrated circuit.

BACKGROUND OF THE INVENTION

Most types of digital hardware include the ability to configure its functionality to support a variety of applications and/or conditions. For instance, a display screen on a phone, which is normally used to display information, such as the number being dialed, incoming caller identification, phone menus, and other similar visual representations, may be configured to temporarily display the output of a camera lens on the phone while a user is in the camera function of the phone. A few other examples of configuration functions include gamma correction of cameras, port definitions for processors, and volume setting for phones.

Configurations are performed by writing control bits to registers, either from external sources or internal sources, such as flash memory within the system or on the same silicon chip as the digital hardware. The control bits are typically written by setting voltage levels on control lines to either a low or a high value. For proper operation, the configurations should stay at the set voltage levels for a designated period of time. An unintended change in the configuration is likely to cause a change in the intended operation of the target hardware element.

An example of a cause of unintended configuration change is an electrostatic discharge (ESD) near a component. An ESD can reset the configuration bits to an unwanted state. Unless the unintended change in configuration is realized, troubleshooting the operation defect is difficult.

Previous design techniques have attempted to control the occurrence of errant configuration changes by ensuring digital noise margins and restricting the range of the voltage using clamping diodes. However, these techniques are to avoid the misconfiguration and do not monitor the settings after the configuration has occurred. Other methods have been to periodically or continuously write configuration states to a memory. The memory is then read to ensure the recorded state is accurate. This method requires a component to have separate outputs to output its control-line state information to a memory. A checker must then access that memory, retrieve the data, and compare it to a standard. The bits are set when the memory is written and only used when the memory is read for use. This method requires excess hardware, steps, and time.

Therefore a need exists to overcome the problems with the prior art as discussed above.

SUMMARY OF THE INVENTION

Briefly, in accordance with the present invention, disclosed is a hardware-verifying circuit arrangement that includes one or more configuration elements operable to configure hardware elements, one or more hardware elements electrically coupled to and configurable by the configuration elements, one or more electrically-conductive pathways coupling at least one of the configuration elements to at least one of the hardware elements, and a hardware-verification register coupled to at least one of the electrically-conductive pathways. The hardware-verification register is able to sample a voltage level on at least one of the electrically-conductive pathways at a first time point, store in a memory one or more bits, each bit representing the voltage level on at least one of the electrically-conductive pathways at the first time point. The hardware-verification register is also able to sample a voltage level on at least one of the electrically-conductive pathways at a second time point and compare, for at least one of the electrically-conductive pathways, the voltage level at the first time point and the voltage level at the second time point.

In one embodiment of the present invention, the hardware-verification register is operable to signal a controller element if the voltage level at the first time point and the voltage level at the second time point vary by more than a predefined amount.

In an embodiment of the present invention, the hardware-verification register samples a voltage level on all of the electrically-conductive pathways substantially simultaneously. In another embodiment, the hardware-verification register sequentially samples a voltage level on each of a plurality of the electrically-conductive pathways.

In one embodiment of the present invention, the hardware-verification register includes a multiplexer that couples the hardware-verification register to a plurality of the electrically-conductive pathways; a combiner coupled to an output of the multiplexer at a first input of the combiner; a first register with an input coupled to an output of the combiner and an output coupled to a second input of the combiner; a second register with an input coupled to the output of the first register; and a comparator with a first input coupled to the output of the first register and a second input coupled to an output of the second register. The circuit arrangement performs steps which include: storing, in the second register, bits output by the multiplexer, the bits representing voltage levels on a plurality of the electrically conductive pathways; outputting, from the multiplexer to the combiner, one or more bits representing voltage levels on a subset of the plurality electrically conductive pathways; combining, with the combiner, the bits received from the multiplexer with bits received from the first register; receiving, at the first register, the combined bits from the combiner; outputting the combined bits to the comparator; and comparing, with the comparator, the combined bits from the first register and stored bits from the second register.

In an embodiment of the present invention, the hardware-verification register includes a plurality of parity checkers that each receive a plurality of inputs and output a voltage level indicating a voltage level of one or more of the plurality of inputs, a register that stores bits representing the output voltage level of one or more of the parity checkers at the first time point, and a comparator that compares the bits stored in the register to a plurality of outputs from the plurality of parity checkers at a second time point.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms as illustrated in the non-limiting exemplary embodiments of FIGS. 1–6. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one, or more than one. The term plurality, as used herein, is defined as two, or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
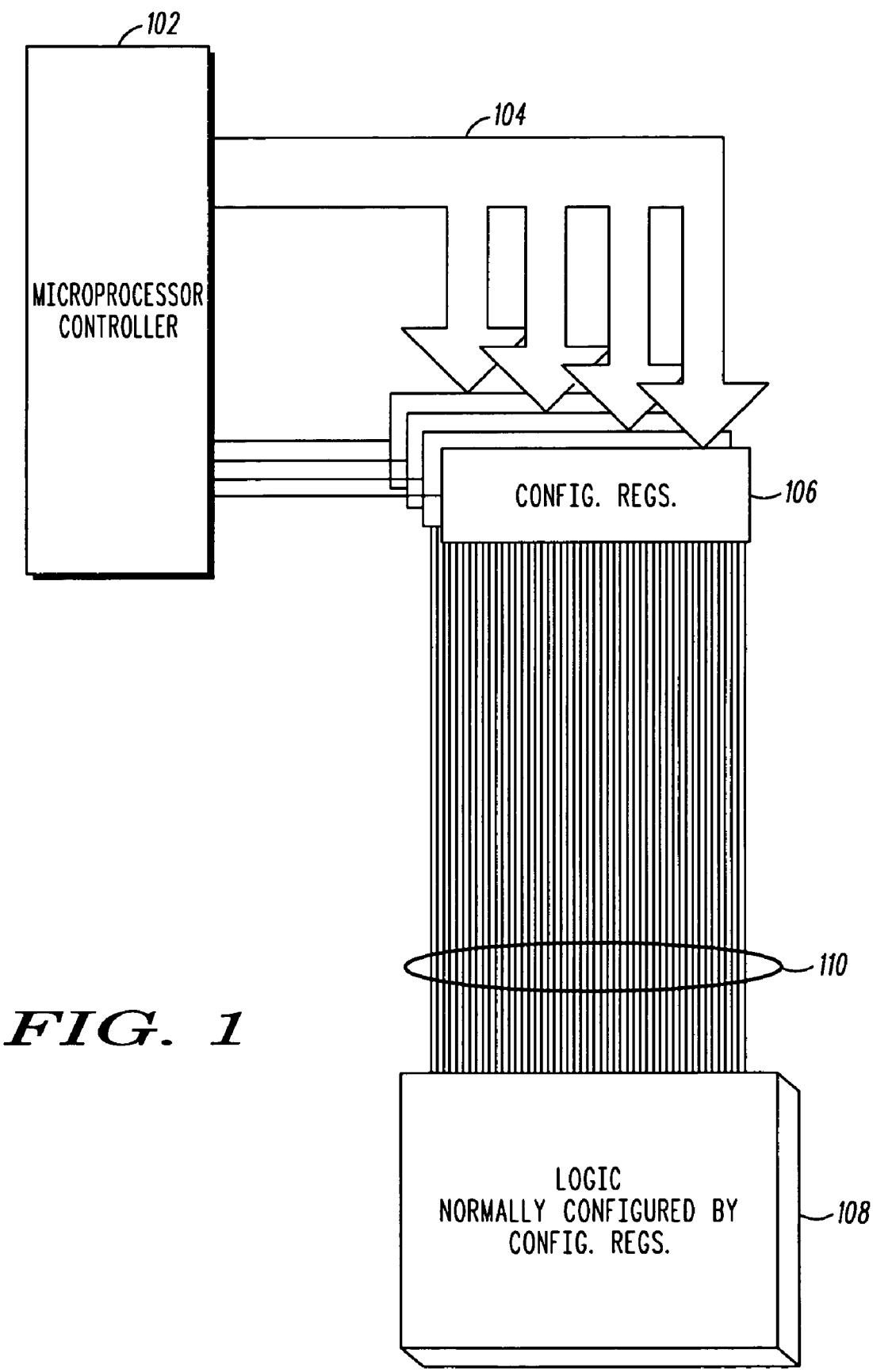
FIG. 1 is an illustration of a circuit configuration suitable for use in an embodiment of the present invention.

Referring now to FIG. 1, a block diagram of a digital circuit 100 is shown that includes a microcontroller 102. Microcontroller 102 is a computer-on-a-chip optimized to control electronic devices. A microcontroller is a type of microprocessor that emphasizes cost-effectiveness and self-sufficiency, in contrast to a general-purpose microprocessor. A typical microcontroller contains all the memory and I/O interfaces needed, whereas a general purpose microprocessor requires additional chips to provide these necessary functions. It should be noted, however, that the invention is not limited to microcontrollers and other processors or state machines can be used and are within the true spirit and scope of the present invention.

Also shown in FIG. 1 is plurality of configuration registers 106. Registers, as used in hardwired logic, are groups of storage areas for hardware input/output (I/O) of varying types. A hardware register is presented to the central processing unit of the computer by means of memory-mapped I/O or port-mapped I/O. Typical uses of hardware registers include configuration and start-up of certain features, especially during initialization, buffer storage e.g. video memory for graphics cards, and status reporting such as whether a certain event has occurred in the hardware unit. To read or write a hardware register, the microcontroller accesses its memory or port-address with a "load" or "store" instruction, issued by the processor. Hardware registers are addressed in words, but sometimes only use a few bits of the word read in to, or written out to, the register.

The microcontroller 102 is coupled to the plurality of configuration registers 106 by a communication infrastructure 104 (e.g., a communications bus, cross-over bar, or network). The configuration registers 106, in turn, are coupled to one or more configurable logic elements 108 through a plurality of electrically conductive pathways 110. The microcontroller 102 provides configuration bits to the configuration registers 106. The configuration registers 106 are coupled to provide the shared control bits from the microcontroller 102 to the logic configuration block 108. The configuration bits are then used to configure the logic elements 108. The configuration bits are intended to only be configurable by the microcontroller 102. The control bits determine how the logic block 108 functions. The logic block 108 represents any number of digital logic elements that may be found in a digital circuit and the microcontroller 102 is free to address and provide control bits to the logic configuration block 108 at any time.

Figure 2:
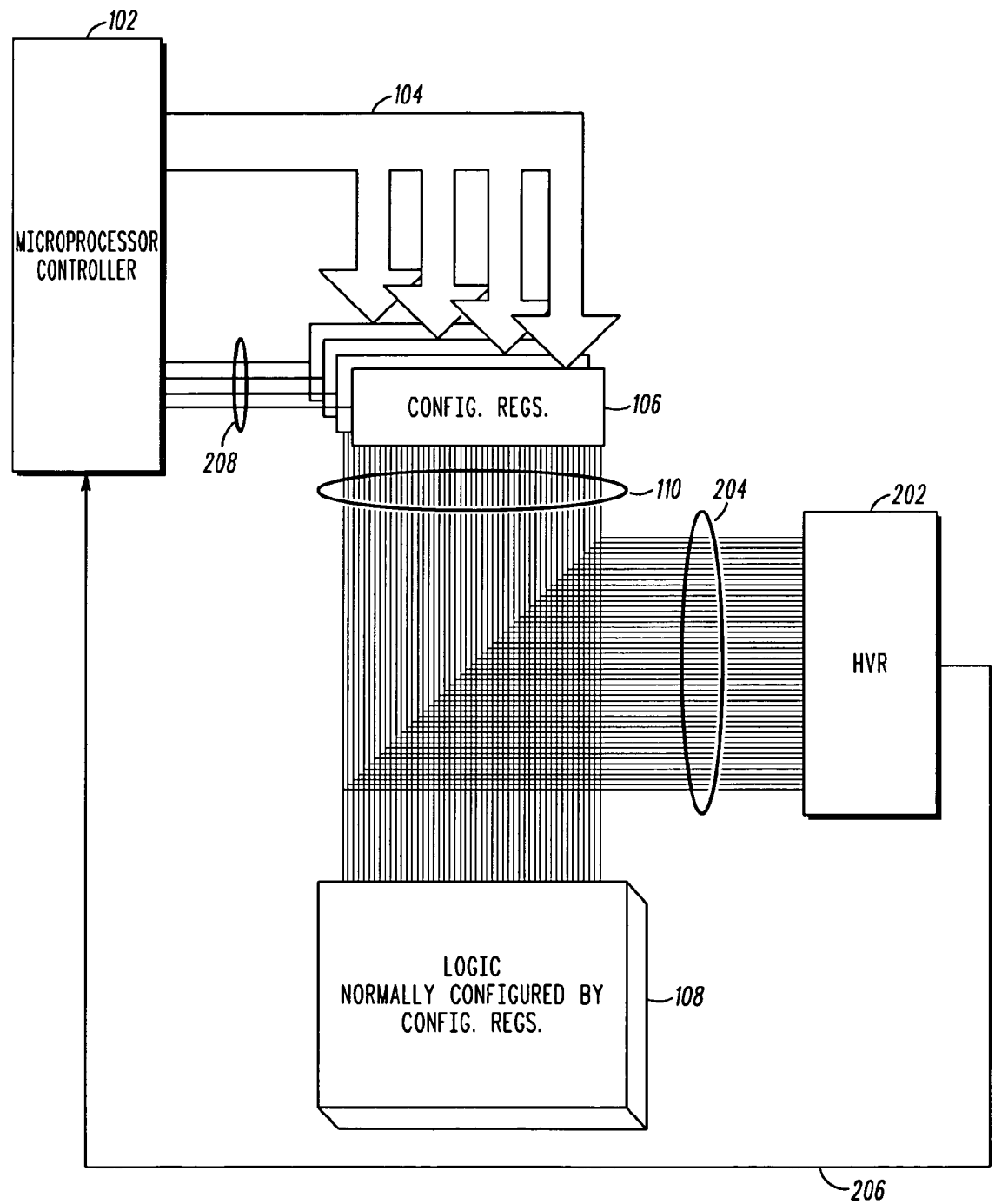
FIG. 2 is an illustration of a corruption detector implemented in the circuit configuration of FIG. 1.

However, if the configuration registers 106 are affected by any unintended and/or unexpected influences, such as power surges, power losses, component glitches, component malfunctions, etc., the configuration registers can be forced to send erroneous signals along the electrically conductive pathways 110 to the logic block 108, resulting in improper operation of the digital device(s). The present invention, as can be seen in FIG. 2, and will be explained in detail below, provides an on-board or on-chip built-in self monitor that continuously or periodically examines the configuration registers 106 to identify the state of the digital logic block devices 108. The invention allows a chip, subsystem, or system to indicate a change has occurred. This indication can be used to take corrective actions, such as reconfiguration to the intended configuration.

In FIG. 2, a hardware-verification register (HVR) 202 monitors the configuration register 106 by tapping into the electrically conductive pathways 110. The HVR 202 can tap into each individual pathway 110 or a subset of all of the pathways 110 through use of tapping lines 204. In a preferred embodiment of the present invention, each tap line 204 is tapped into a separate one of the individual pathways. In yet another embodiment, the HVR 202 continuously samples the voltage levels on the electrically conductive pathways 110 to identify an unintended change in configuration.

In a first embodiment, the HVR 202 is a register that includes a check, such as parity or hash as is known in the art. The HVR 202 performs a simple parity check of two or more of the electrically conductive pathways 110 to be monitored. If a voltage on one of the lines suddenly varies from the one or more others, a change in configuration is detected by the HVR 202. In one embodiment, the HVR 202 responds to the detected configuration change by transmitting a signal to the microcontroller 102 through a signal line 206. The microcontroller can respond by resetting the configuration registers through reset lines 208 and/or retransmits the configuration information to the configuration registers 106 through the communication infrastructure 104. It is important to note that the present invention is in no way limited to any particular response to a detection of configuration corruption.

Figure 3:
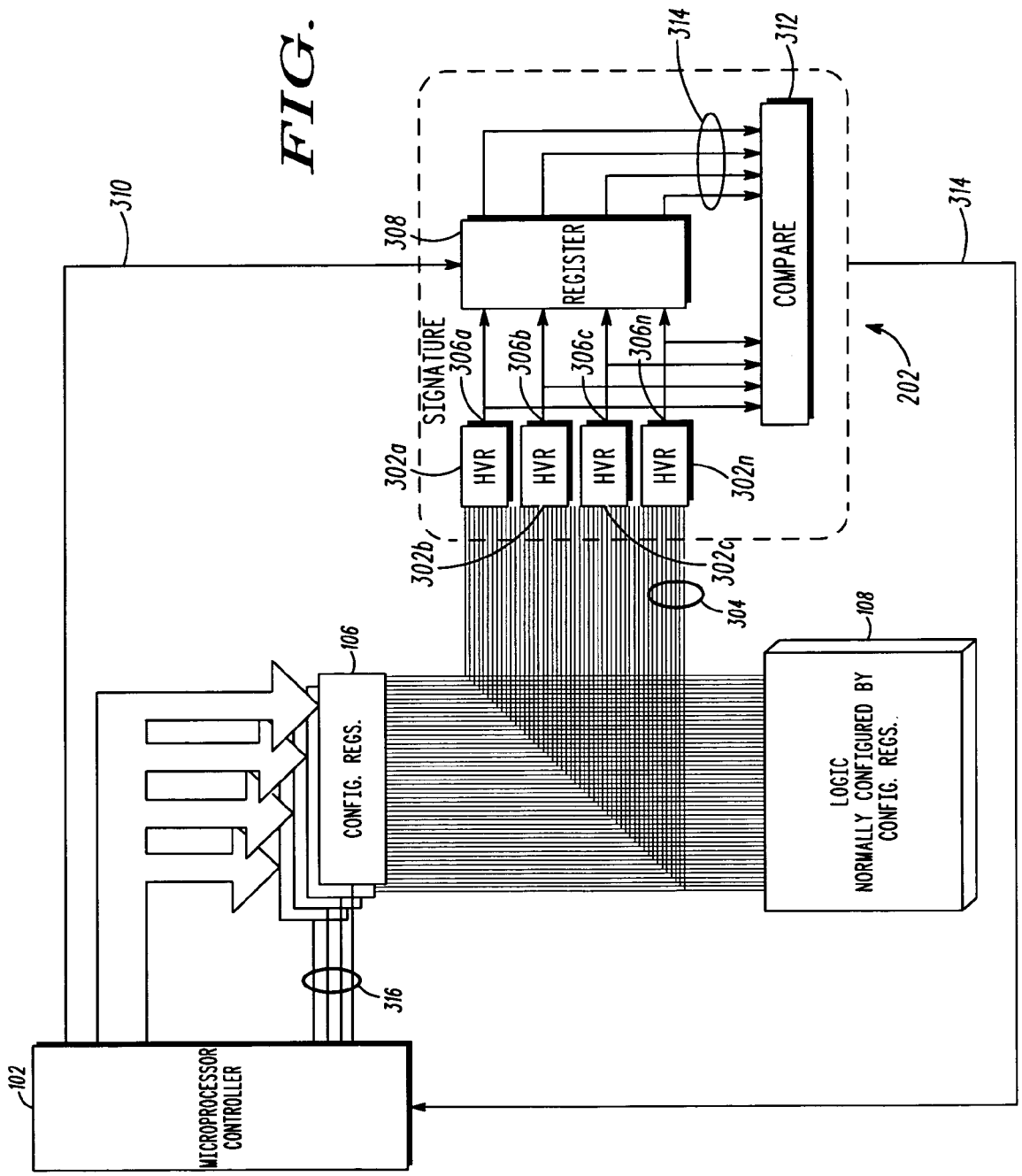
FIG. 3 is an illustration of a second embodiment of the corruption detector of FIG. 2 implemented in the circuit configuration of FIG. 1.

Another embodiment of the HVR 202 is shown in FIG. 3. In the embodiment of FIG. 3, the HVR 202 has a plurality of hardware verification registers (HVR) 302a–n. Each HVR 302 accepts a plurality of inputs 304 and outputs a signal on a single output line 306. In one embodiment, if all of the inputs 304 are high, the HVR 302 will output a high signal to indicate that all of the inputs 302 are high. Conversely, if one of the inputs 304 is not high, the HVR 302 will output 306 a low, or no, voltage signal that indicates this fact. The high and low signal just described are exemplary only and the present invention is in no way limited to these responses to parity checks.

The plurality of outputs 306a–n of the HVRs 302a–n are fed to a register 308 that stores a "signature" of the configuration. For instance, if the first and fourth HVRs 302a and 302d output a high voltage and the second and third HVRs 302b and 302c output a low voltage, the signature stored in the register 308 would be 1001. The 1001 signature indicates that all of the lines input to the first and fourth parity checkers are high and not all of the lines input to the second and third parity checkers are high. Of course, other voltages and representations can be used to indicate the states of the configuration bits on the electrically conductive pathways 110.

In the embodiment of FIG. 3, a sample line 310 allows the microcontroller 102 to cause the register 308 to clear the previously stored signature and to sample and save a new signature. This sample and store feature loads a new "Golden Standard" signature in the register 308. The Golden Standard is a value that is assumed to be indicative of a properly configured logic block and is continuously compared to the active signature received from the HVRs 302a–n, which reflects the current state of the electrically conductive pathways 110. The comparison is accomplished through the use of a comparator 312.

The comparator 312 receives the output 306 of the HVRs 302a–n as well as the output 314 of the register 308 and compares the two signatures. If a difference is detected, the comparator 312 signals the microcontroller 102 through a signal line 314. The microcontroller's response can vary. In one embodiment, the microcontroller 102 reconfigures the configuration registers through reset lines 316, which cause the registers to store new bit information received through the communication infrastructure 104 (e.g., a communications bus, cross-over bar, or network). In another embodiment, the microcontroller 102 switches to a back up system (not shown) until the source of the change in configuration is isolated and corrected.

Figure 4:
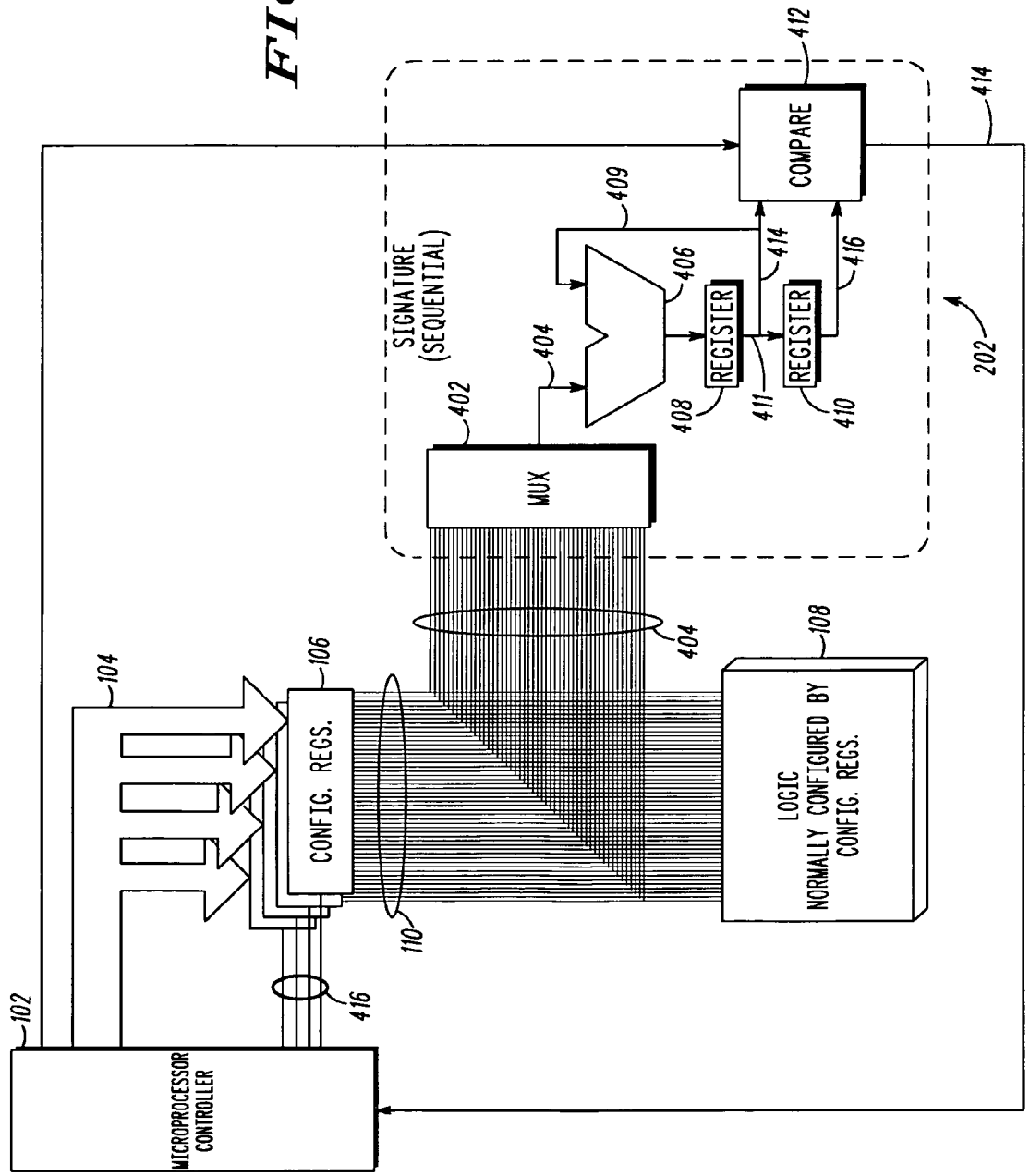
FIG. 4 is an illustration of a third embodiment of the corruption detector of FIG. 2 implemented in the circuit configuration of FIG. 1.

Yet another embodiment of the HVR 202 is shown in FIG. 4. The embodiment of FIG. 4 is useful for sequentially sampling the electrically conductive pathways 110 coupling the configuration registers 106 to the logic blocks 108. The HVR 202 includes a multiplexer 402 that is tapped into the electrically conductive pathways 110 through a plurality of taps 404. The multiplexer 402 is able to sequentially sample individual pathways 110 and output 404 to an accumulator 406 a plurality of electrical pathways indicating the signature on the sampled pathway 110. The accumulator 406 then adds the input from the multiplexer 402 to a current word and passes it on to a first register 408 via output 407. If the word is not yet complete with all the bit values being reflected, feedback line 409 provides the current word to the accumulator 406 where a new bit pattern is received from the multiplexer 402 and added to the current word. The word is continuously passed back and forth between the accumulator and the first register until the word contains information pertaining to all of the lines 110 intended to be monitored for configuration changes. Once the word is complete, it is passed to a second register 410, via output 411, where it is stored as a "golden standard," to which future samples will be compared.

Once the golden standard is stored, the word in the first register 408 is reset and the process starts again to form a new version of the word. The newly constructed word output from the first register 408 is fed along line 414 to a comparator 412, where the word is compared to the golden standard word output from the second register 410 along output line 416. If a difference is detected, the comparator 412 signals the microcontroller 102 through a signal line 414. The microcontroller's response can vary. In one embodiment, the microcontroller 102 resets the configuration registers 106 through reset lines 416, which cause the registers to store new bit information received through the communication infrastructure 104 (e.g., a communications bus, cross-over bar, or network). In another embodiment, the microcontroller 102 switches to a back up system (not shown) until the source of the change in configuration is isolated and corrected.

Figure 5:
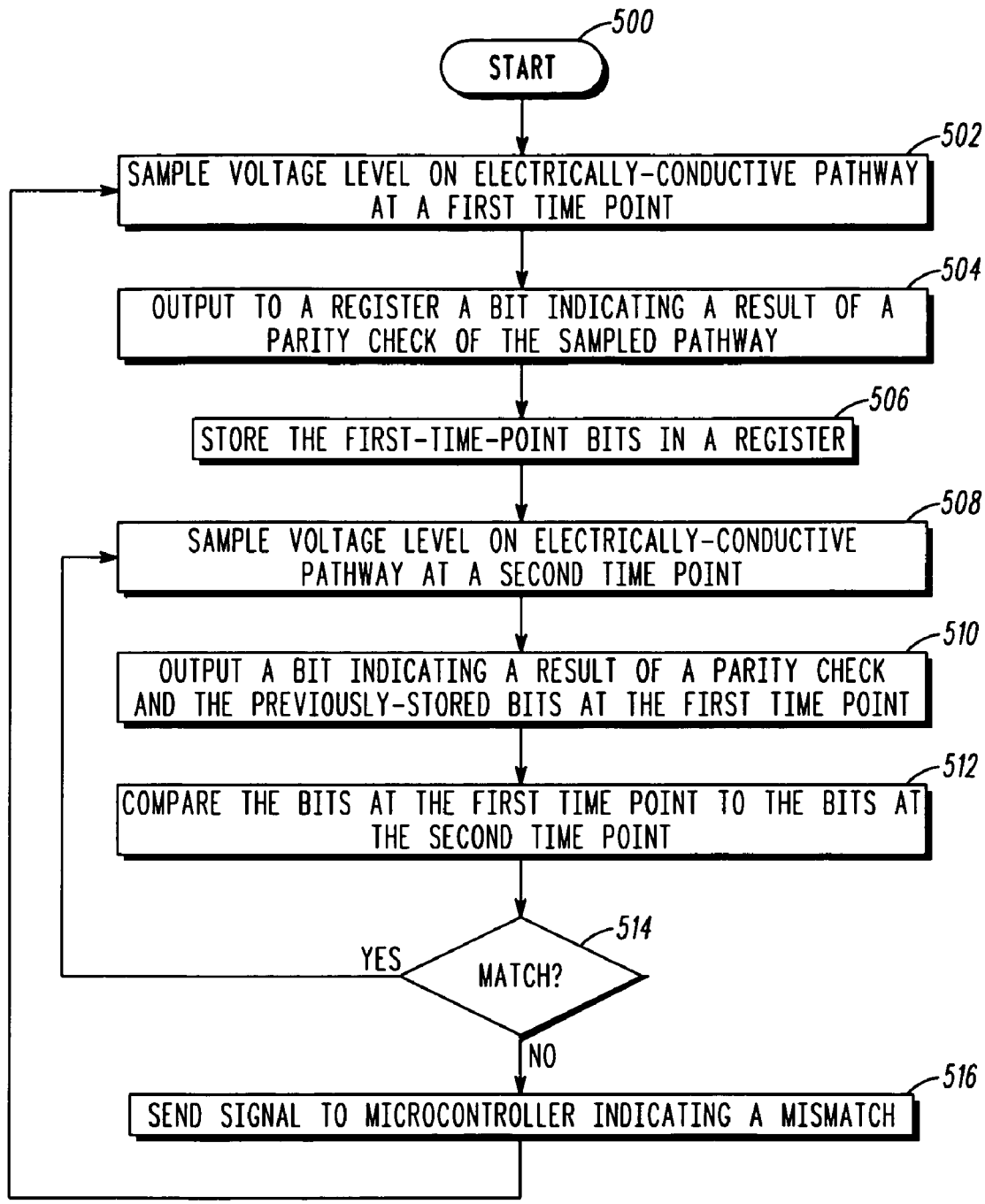
FIG. 5 is a flow diagram of corruption detection process according to an exemplary embodiment of the present invention.

FIG. 5 shows a flow diagram illustrating the steps of the present invention as shown in the embodiment of FIG. 3. The flow begins at step 500 and moves directly to step 502 where a voltage level on at least one of the electrically-conductive pathways 110 coupling the configuration element 106 to the hardware element(s) 108 is sampled by a plurality of parity checkers 302a–n. Since there will be additional samples, this first sample is defined as the sample taken at a first time point. Next, in step 504, each of the parity checkers 302 outputs to a register 308 a bit indicating a result of a parity check of the sampled pathways 110. The register 308 stores the first-time-point bits in a memory in step 506. In step 508, the voltage level on at least one of the electrically-conductive pathways 110 coupling the configuration element 106 to the hardware element 108 is sampled at a second time point by the plurality of parity checkers 302a–n. In step 510, as in step 504, each of the parity checkers 302 outputs a bit indicating a result of a parity check of the sampled pathways 110. However, in step 510, the bits are output to comparator 312. Either simultaneously, or shortly thereafter, the register 308 outputs to the comparator 312 the previously stored "Golden Standard" bits identifying the state of the electrically-conductive pathways 110 at the first time point. In step 512, the comparator 312 compares the bits at the first time point to the bits at the second time point. If the result of the comparison, step 514, is the identification of a mismatch, a signal is sent at step 516 to the microcontroller indicating the mismatch. In one embodiment of the present invention, a mismatch is indicated only if the first time point and second time point vary by more than a predefined amount, or threshold. However, the predefined amount can be zero volts. The flow repeats indefinitely with step 516 going back to step 502. If the result of the comparison is a match, the flow moves back to step 508, where the lines are sampled again at a new time point.

Figure 6:
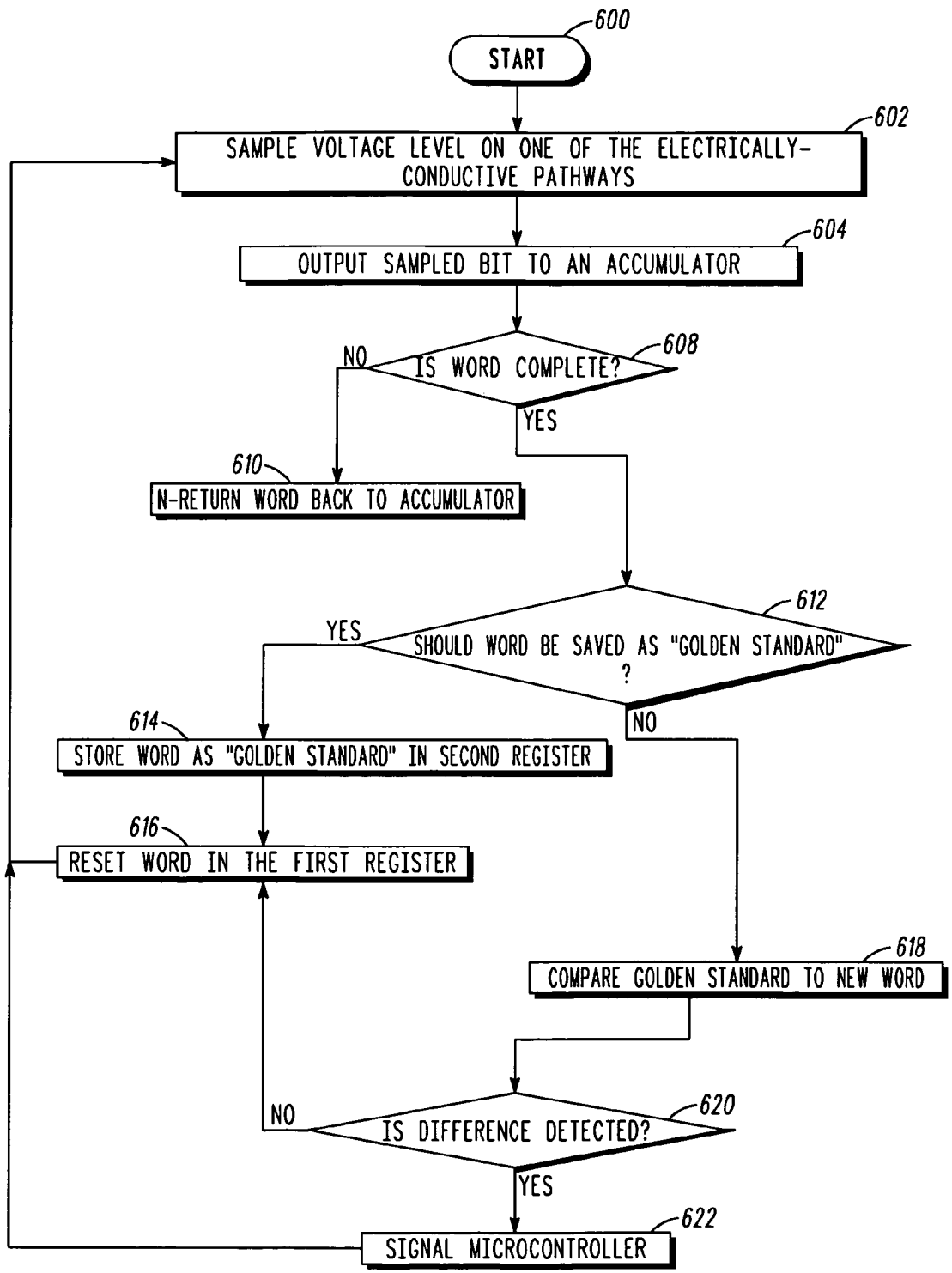
FIG. 6 is a flow diagram of corruption detection process according to an exemplary embodiment of the present invention.

FIG. 6 shows a flow diagram illustrating the steps of the present invention as embodied the embodiment of FIG. 4. The flow begins at step 600 and moves directly to step 602 where a voltage level on at least one of the electrically-conductive pathways 110 coupling the configuration element 106 to the hardware element 108 is sampled by a multiplexer 402. The multiplexer 402, in step 604, outputs the first sampled bit to an accumulator 406. The bit indicates a voltage level on the sampled pathway 110. The accumulator 406 then, in step 606, adds the input from the multiplexer 402 to a word and passes it on to a first register 408. In step 608, a check is performed to determine whether the word is a complete. That is, a check is performed to see if all of the bits that are needed to determine a change-in-configuration have been sampled.

If the word is not complete, the word is returned back to the accumulator 406 in step 610 and then passed back up to step 602 where a new bit is received from the multiplexer 402 and added to the word. If the result of the test in step 608 is "yes," the flow moves to another decision step 612, where it is determined whether a golden standard should be saved. If the answer is "yes," the word is passed to a second register 410, in step 614, where it is stored as a "golden standard," to which future samples will be compared.

Once the golden standard is stored, the word in the first register 408 is reset, in step 616, and the process starts again at step 602 to collect a new word. The flow moves all the way back down to step 612, where this time the answer is "no." In this event, the flow moves to step 618 where the golden standard value is compared to the new word by a comparator 412. If a difference is detected in step 620, the comparator 412 signals, in step 622, the microcontroller 102 through a signal line 414. The flow then moves back to step 602. If no difference is detected, the flow moves back to step 616, where the first register is reset and the process begins again at step 602.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A hardware-verifying circuit arrangement comprising:
   one or more configuration elements operable to configure hardware elements;
   one or more hardware elements electrically coupled to and configurable by the configuration elements;
   one or more electrically-conductive pathways coupling at least one of the configuration elements to at least one of the hardware elements; and
   a hardware-verification register coupled to at least one of the electrically-conductive pathways,
   wherein the hardware-verification register is operable to:
      sample a voltage level on at least one of the electrically-conductive pathways at a first time point;
      store in a memory one or more bits, each bit representing the voltage level on at least one of the electrically-conductive pathways at the first time point;
      sample a voltage level on at least one of the electrically-conductive pathways at a second time point; and
      compare, for at least one of the electrically-conductive pathways, the voltage level at the first time point and the voltage level at the second time point.

2. The hardware-verifying circuit arrangement according to claim 1, wherein the hardware-verification register is operable to signal a controller element if the voltage level at the first time point and the voltage level at the second time point vary by more than a predefined amount.

3. The hardware-verifying circuit arrangement according to claim 2, wherein the predefined amount is about zero volts.

4. The hardware-verifying circuit arrangement according to claim 1, wherein the configuration element is one of a register, a port, and a static device.

5. The hardware-verifying circuit arrangement according to claim 1, wherein the hardware-verification register samples a voltage level on all of the electrically-conductive pathways substantially simultaneously.

6. The hardware-verifying circuit arrangement according to claim 1, wherein the hardware-verification register sequentially samples a voltage level on each of a plurality of the electrically-conductive pathways.

7. The hardware-verifying circuit arrangement according to claim 1, wherein the hardware-verification register comprises:
   a multiplexer that couples the hardware-verification register to a plurality of the electrically-conductive pathways;
   a combiner coupled to an output of the multiplexer at a first input of the combiner;
   a first register with an input coupled to an output of the combiner and an output coupled to a second input of the combiner;
   a second register with an input coupled to the output of the first register; and
   a comparator with a first input coupled to the output of the first register and a second input coupled to an output of the second register,
   wherein the circuit arrangement includes means for:
      storing, in the second register, bits output by the multiplexer, the bits representing voltage levels on a plurality of the electrically conductive pathways;
      outputting, from the multiplexer to the combiner, one or more bits representing voltage levels on a subset of the plurality electrically conductive pathways;
      combining, with the combiner, the bits received from the multiplexer with bits received from the first register;
      receiving, at the first register, the combined bits from the combiner;
      outputting the combined bits to the comparator; and
      comparing, with the comparator, the combined bits from the first register and stored bits from the second register.

8. The hardware-verifying circuit arrangement according to claim 1, wherein the hardware-verification register comprises:
   a plurality of parity checkers that each receive a plurality of inputs and output a voltage level indicating a voltage level of one or more of the plurality of inputs;
   a register that stores bits representing the output voltage level of one or more of the parity checkers at the first time point; and
   a comparator that compares the bits stored in the register to a plurality of outputs from the plurality of parity checkers at a second time point.

9. A method for verifying a circuit arrangement, the method comprising:
   sampling, at a first time point, a voltage level on at least one electrically-conductive pathway coupling a configuration element and a hardware element;
   storing one or more bits in a memory, the bits representing at least one of the voltage levels at the first time point;
   sampling, at a second time point, a voltage level on at least one of the electrically-conductive pathways; and
   comparing at least one of the stored voltage levels at the first time point with at least one of the sampled voltage levels at the second point, the compared voltages having been sampled from a same electrically-conductive pathway.

10. The method according to claim 9, further comprising:
   transmitting a signal if the comparing step yields a variation that is greater than a pre-selected threshold value.

11. The method according to claim 10, wherein the transmitted signal is sent to a microcontroller.

12. The method according to claim 9, wherein the sampling comprises:
    receiving, at each of a plurality of parity checkers, a plurality of input voltages; and
    outputting, from each of the plurality of parity checkers, a voltage that represents the input voltages received at the parity checker.

13. A computer program product for verifying a circuit arrangement, the computer program product comprising:
    a storage medium readable by a processing circuit and storing instructions for execution by the processing circuit for performing a method comprising:
        sampling, at a first time point, a voltage level on at least one electrically-conductive pathway coupling a configuration element and a hardware element;
        storing one or more bits in a memory, the bits representing at least one of the voltage levels at the first time point;
        sampling, at a second time point, a voltage level on at least one of the electrically-conductive pathways; and
        comparing at least one of the stored voltage levels at the first time point with at least one of the sampled voltage levels at the second point, the compared voltages having been sampled from a same electrically-conductive pathway.

14. The computer program product according to claim 13, further comprising:
    transmitting a signal if the comparing step yields a variation that is greater than a pre-selected threshold value.

15. The computer program product according to claim 14, wherein the transmitted signal is sent to a microcontroller.

16. The computer program product according to claim 13, wherein the sampling comprises:
    receiving, at each of a plurality of parity checkers, a plurality of input voltages; and
    outputting, from each of the plurality of parity checkers, a voltage that represents the input voltages received at the parity checker.

* * * * *